(12) United States Patent
Braunisch et al.

(10) Patent No.: US 6,927,496 B2
(45) Date of Patent: Aug. 9, 2005

(54) WAFER-LEVEL THICK FILM STANDING-WAVE CLOCKING

(75) Inventors: Henning Braunisch, Chandler, AZ (US); Steven N. Towle, deceased, late of Phoenix, AZ (US); by Anna M. George, legal representative, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/676,958

(22) Filed: Sep. 30, 2003

(65) Prior Publication Data

US 2005/0070087 A1 Mar. 31, 2005

(51) Int. Cl.[7] ............................................... H01L 23/48
(52) U.S. Cl. ........................ 257/758; 257/750; 257/759
(58) Field of Search ................................. 257/750, 758, 257/759

(56) References Cited

U.S. PATENT DOCUMENTS

| | | | |
|---|---|---|---|
| 5,387,885 A | 2/1995 | Chi | |
| 5,640,112 A | 6/1997 | Goto et al. | |
| 6,037,822 A | * 3/2000 | Rao et al. | 327/298 |
| 6,522,186 B2 | * 2/2003 | O'Mahony et al. | 327/295 |
| 6,586,276 B2 | 7/2003 | Towle et al. | |
| 6,593,793 B1 | 7/2003 | Braunisch et al. | |
| 6,720,814 B2 | * 4/2004 | Braunisch et al. | 327/291 |

OTHER PUBLICATIONS

Vernon L. Chi, Salphasic Distribution of Clock Signals for Synchronous Systems, IEEE Transactions on Computers, vol. 43, No. 5, May 1994.

* cited by examiner

*Primary Examiner*—Christian Wilson
(74) *Attorney, Agent, or Firm*—Blakely, Sokoloff, Taylor & Zafman LLP

(57) ABSTRACT

An embodiment of the present invention is a technique to distribute clock. At least a metal layer is formed to have a standing-wave structure to distribute a clock signal to receiver end points from a clock source such that the receiver end points are substantially electrically equivalent with respect to the clock source. The metal layer is embedded in dielectric layers made of thick film using a wafer-level thick film (WLTF) process.

20 Claims, 3 Drawing Sheets

US 6,927,496 B2

WAFER-LEVEL THICK FILM STANDING-WAVE CLOCKING

BACKGROUND

FIELD OF THE INVENTION

Embodiments of the invention relate to the field of semiconductors, and more specifically, to clocking.

DESCRIPTION OF RELATED ART

Standing-wave clocking offers the advantages of scalability with respect to clock frequency, low power consumption, and simplified clock system design. However, there are a number of problems of using standing-wave clocking in microelectronic high performance systems. These problems include: (1) loss-induced skew, (2) inequality of clock signal amplitudes at different clock receivers leading to skew, (3) clock phase difference of ±180° between different clock receivers, and (4) migration of voltage nodes across clock distribution points due to frequency tuning, leading to failure of the clocking system at critical clock speeds.

Existing techniques to solve the above problems are inadequate. One approach to overcome the loss-induced skew is regenerative loading of a lossy standing-wave structure for active loss compensation. This approach may have stability problems. Another approach is to place the standing-wave structure on the package where high-Q components are more readily implemented. However, this approach may hinder the testing and sorting of dies at the wafer level. Other approaches include dedicated designs supported by accurate modeling, but the resulting design complexities may be prohibitive.

BRIEF DESCRIPTION OF THE DRAWINGS

The invention may best be understood by referring to the following description and accompanying drawings that are used to illustrate embodiments of the invention. In the drawings.

DESCRIPTION

An embodiment of the present invention is a technique to distribute clock. At least a metal layer is formed to have a standing-wave structure to distribute a clock signal to receiver end points from a clock source such that the receiver end points are substantially electrically equivalent with respect to the clock source. The metal layer is embedded in dielectric layers made of thick film using a wafer-level thick film (WLTF) process.

In the following description, numerous specific details are set forth. However, it is understood that embodiments of the invention may be practiced without these specific details. In other instances, well-known circuits, structures, and techniques have not been shown in order not to obscure the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, a method of manufacturing or fabrication, etc.

One embodiment of the present invention integrates a standing-wave clock distribution structure into package-type thick film layers on the wafer above the standard back end interconnect layers using a WLFT technology. The distribution structure uses a source symmetric design.

Figure 1:
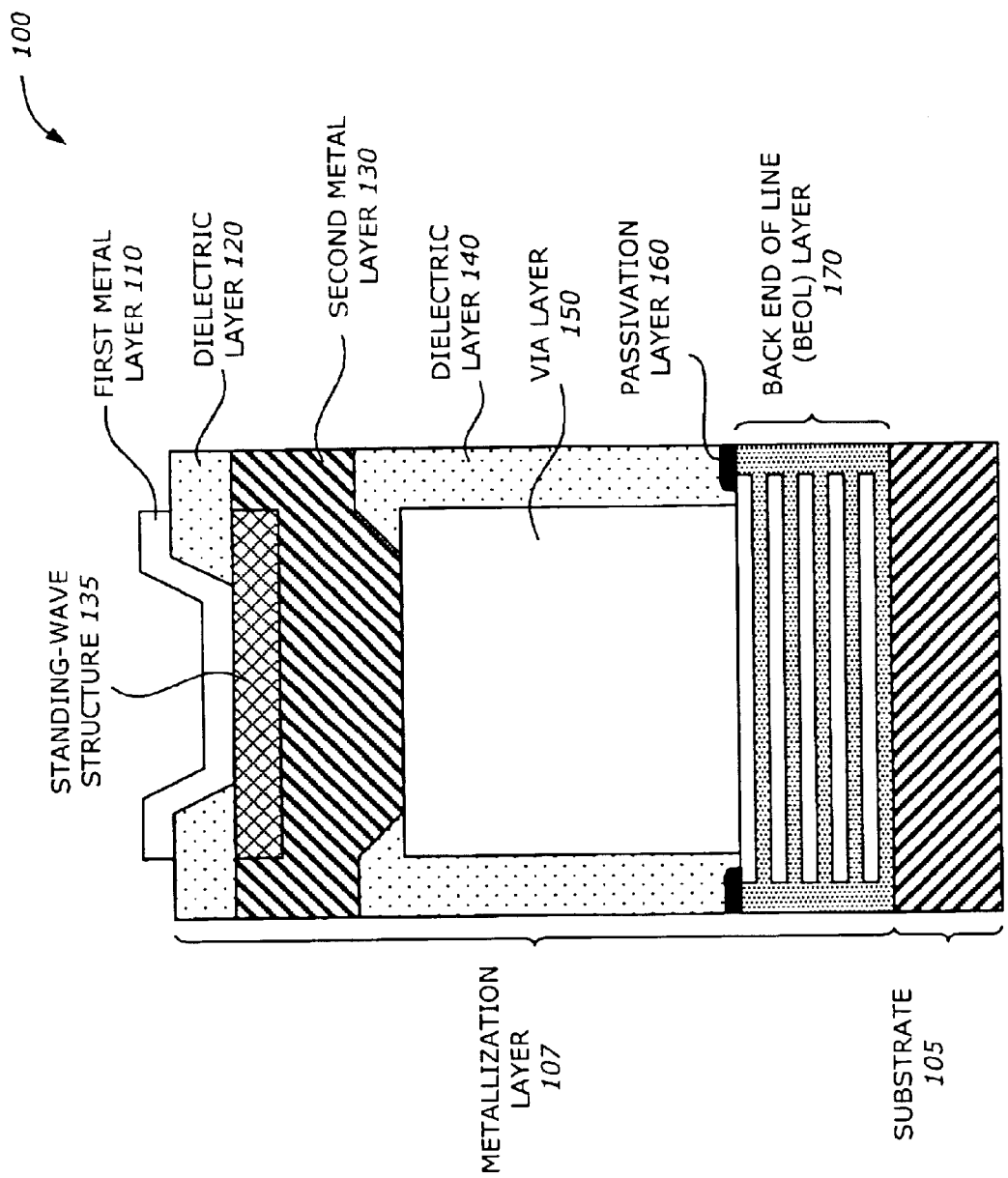
FIG. 1 is a diagram illustrating a die in which one embodiment of the invention can be practiced.

FIG. 1 is a diagram illustrating a die 100 in which one embodiment of the invention can be practiced. The die 100 includes a substrate 105 and a metallization layer 107.

The substrate 105 is any substrate used in semiconductor device fabrication. It may be made of silicon. The metallization layer 107 provides interconnections to other circuits and device structures. The metallization layer 107 is fabricated using a wafer-level thick film (WLTF) technology. The metallization layer 107 includes a first metal layer 110, a dielectric layer 120, a second metal layer 130, a dielectric layer 140, a via layer 150, a passivation layer 160, and a back end of line (BEOL) layer 170.

The first metal layer 110 provides interconnection contact to other circuits. In one embodiment, it is made of copper (Cu) and has a thickness of approximately 2 $\mu$m. The dielectric layer 120 is made of dielectric material, preferably a low-k material such as benzocyclobutene (BCB), and has a typical thickness of 5 $\mu$m. The second metal layer 130 is typically made of copper and has a thickness of between 10 $\mu$m to 50 $\mu$m. It is below the bump layer (e.g., C4 layer). The metal layer 130 has a standing-wave structure 135 to distribute a clock signal. The metal layer 130 is embedded in the dielectric layers 120 and 140. The dielectric layer 140 is made of dielectric material such as BCB and has a typical thickness of 16 $\mu$m. The via layer provides vias having high aspect ratio. It is typically made of copper and has as typical thickness of 14 $\mu$m. The passivation layer 160 provides protection to other layers and is made of suitable materials such as silicon nitride or silicon oxide composites and has a thickness of approximately from 20 nm to 50 nm. The BEOL layer 170 typically has five to eight layers of copper and dielectrics.

Figure 2:
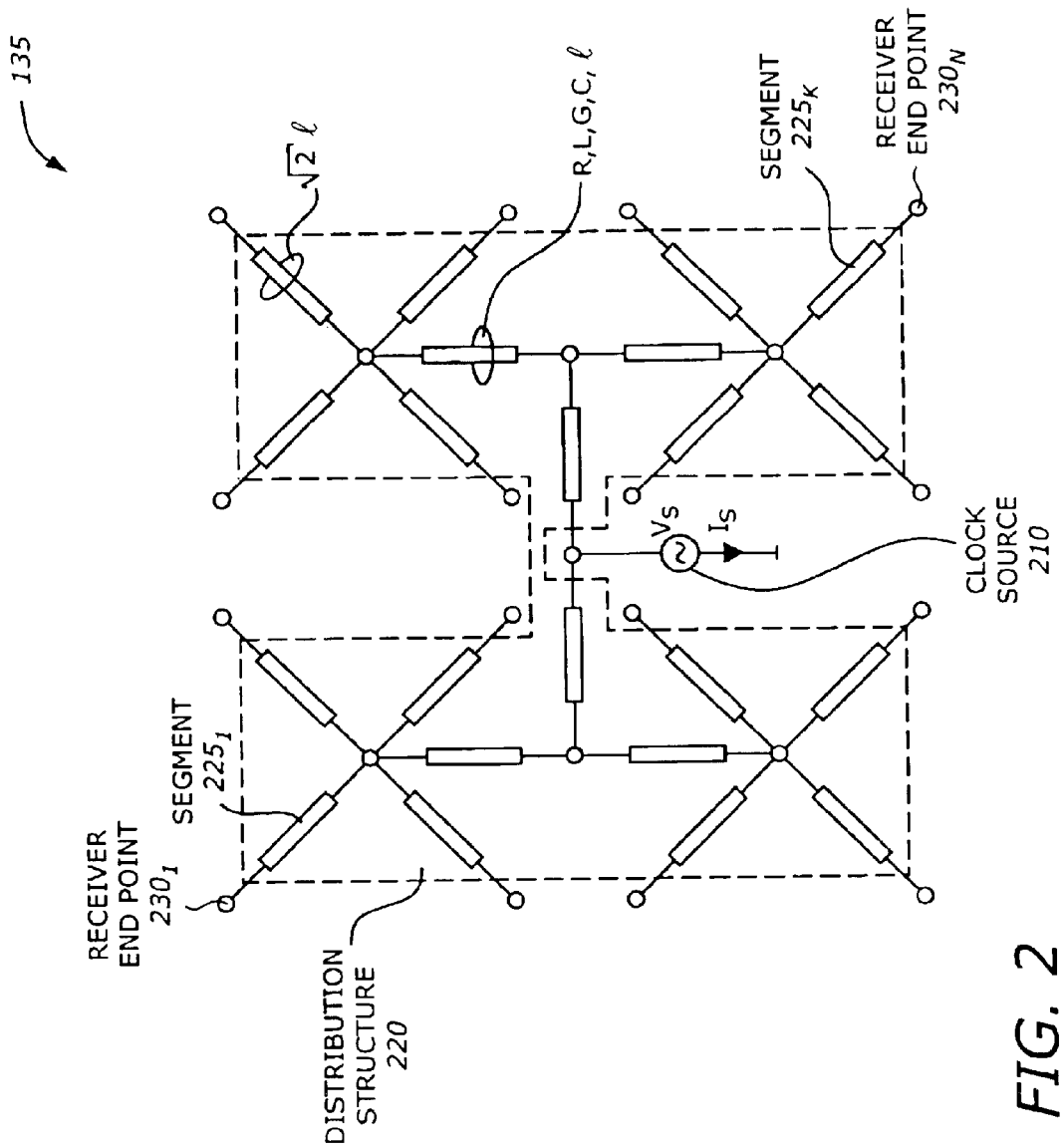
FIG. 2 is a diagram illustrating a standing-wave structure according to one embodiment of the invention.

FIG. 2 is a diagram illustrating a standing-wave structure 135 according to one embodiment of the invention. The standing-wave structure includes a clock source 210, a distribution structure 220, and N receiver end points $230_1$ to $230_N$.

The clock source 210 is any clock source that provides a clock signal. The clock source 210 may include a current source and an oscillator. The clock source 210 generates the clock signal to be distributed to the N receiver end points $230_1$ to $230_N$ through the distribution structure 220. The distribution structure 220 includes traces or wires that carry the clock signal in a pattern. The distribution structure 220 is configured such that all the receiver end points are substantially electrically equivalent with respect to the clock source 210. Typically, the distribution structure 220 is symmetrical around the clock source. In one embodiment, the distribution structure 220 follows a pattern having an M-ary tree such as a binary tree (M=2), a quaternary tree (M=4), or any combination of M-ary trees of different degrees M. The distribution structure 220 includes K segments $225_1$ to $225_K$. Each segment is between two branch points or nodes. Each segment represents a transmission line of the structure and is electrically characterized by resistance, inductance, conductance, and capacitance per unit length. Different segments may have different lengths and different electrical characteristics.

The source symmetric structure of the standing-wave structure 135 has a number of advantages. First, it can retain the general advantages of the standing-wave clocking such as scalability with respect to clock frequency, low power consumption, and simplification of clock system design. Second, it can eliminate known standing-wave clocking problems including loss-induced skew, inequality of clock signal amplitudes at different clock receivers leading to skew, clock phase difference of ±180° between different clock receivers, and migration of voltage nodes across clock distribution points due to frequency tuning leading to failure of clocking at critical clock speeds. Third, it is similar to on-package standing-wave clocking but avoids the on-package clocking problems of sort and test of dies at the wafer level, limited availability of connections (e.g., bumps) between die and package for clocking, and electrical parasitics of necessary vertical die-package interconnection. Fourth, it is implementable using a single thick film metal layer with differential clock line design. Other general benefits include robustness with respect to process and clock frequency variations, combination with other WLTF benefits such as buffering of thermo-mechanically induced stresses that are detrimental for low-k interlayer dielectrics (ILD), and power delivery mitigation.

The source symmetric design eliminates the problems of loss-induced skew, skew due to inequality of clock signal amplitudes, and clock phase difference by principle of construction. It eliminates the problem of migration of voltage nodes due to frequency tuning if a distribution end point is located at the end of a transmission line branch as any one of the N receiver end points $230_1$ to $230_N$. This can be proved as follows. At such a point, the total voltage is $V=V_i (1+R)$ where $V_i$ is the amplitude of the incident voltage wave and R is the reflection coefficient at the end point. Since the end point is loaded with a clock receiver with non-zero input impedance, it is not shorted, i.e., $R \neq -1$. Therefore, $V \neq 0$, independent of frequency. Moreover, a high input impedance of the clock receiver leads to a node for current at the end point that coincides with an anti-node for voltage. Therefore, the voltage amplitude is always maximized at the clock receiver input.

Even if the ideal source symmetry in actual fabricated samples is not achieved due to process variations and manufacturing tolerances, the source symmetric design still leads to a certain degree of robustness to perturbations of the system. In the absence of loss, the source symmetry is not required to achieve zero skew. But if loss is present, then perturbations of a source symmetric structure lead to only small skew.

The standing-wave structure 135 may be two-dimensional as in a metal layer or three-dimensional (3-D). In a 3-D configuration, more than one layer may be used to have parts of the standing-wave structure 135. The standing-wave structure 135 may also be located on a second die in a stacked-die configuration or be located at the backside of a die in combination with through-silicon technology.

Figure 3:
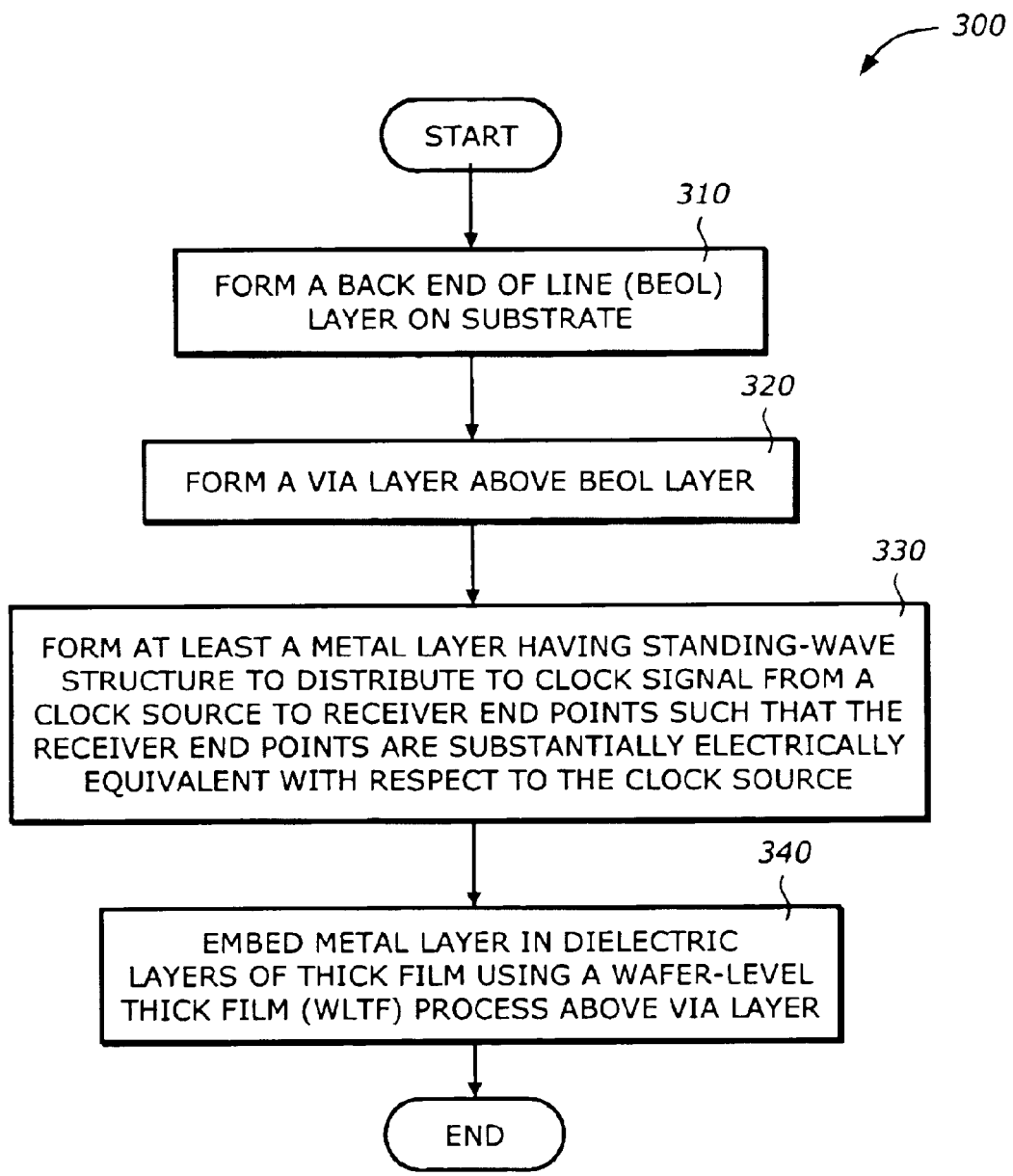
FIG. 3 is a flowchart illustrating a process to distribute clock according to one embodiment of the invention.

FIG. 3 is a flowchart illustrating a process 300 to distribute clock according to one embodiment of the invention.

Upon START, the process 300 forms a Back End of Line (BEOL) layer on a substrate (Block 310). Next, the process 300 forms a via layer above the BEOL layer (Block 320). Typically, the via layer has high aspect ratio vias.

Then, the process 300 forms at least a metal layer having a standing-wave structure to distribute a clock signal from a clock source to a number of receiver end points such that the receiver end points are substantially electrically equivalent with respect to the clock source (Block 330). The standing-wave structure may be one of an M-ary tree and a combination of M-ary trees of different degrees M. It may be formed in one of a two-dimensional configuration, a three-dimensional configuration, and a stacked-die configuration. Then, the process 300 embeds the metal layer in dielectric layers made of thick film using a wafer-level thick film process above the via layer (Block 340). The dielectric layer may be made by any dielectric material such as BCB. The process 300 is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A device comprising:
    dielectric layers made of thick film; and
    at least one metal layer embedded in the dielectric layers and having a standing-wave structure to distribute a clock signal to receiver end points from a clock source such that the receiver end points are substantially electrically equivalent with respect to the clock source.

2. The device of claim 1 wherein the standing-wave structure is one of a M-ary tree and a combination of M-ary trees of different degrees M.

3. The device of claim 1 wherein the standing-wave structure is in one of a two-dimensional configuration and a three-dimensional configuration.

4. The device of claim 1 wherein the standing-wave structure is in a stacked-die configuration.

5. The device of claim 1 further comprising:
    a via layer below the metal layer.

6. The device of claim 5 further comprising:
    a back end of line (BEOL) layer below the via layer and on a substrate.

7. The device of claim 6 wherein the BEOL layer is made of copper and dielectrics.

8. The device of claim 1 wherein the metal layer comprises:
    at least one power delivery area.

9. The device of claim 1 wherein the dielectric layers are made of benzocyclobutene (BCB).

10. The device of claim 1 wherein the metal layer has a thickness between 10 microns to 50 microns.

11. A die comprising:
    a substrate; and
    a metallization layer on the substrate, the metallization layer comprising:
        dielectric layers made of thick film, and
        a metal layer embedded in the dielectric layers and having a standing-wave structure to distribute a clock signal to receiver end points from a clock source such that the receiver end points are substantially electrically equivalent with respect to the clock source.

12. The die of claim 11 wherein the standing-wave structure is one of an M-ary tree and a combination of M-ary trees of different degrees.

13. The die of claim 11 wherein the standing-wave structure is in one of a two-dimensional configuration and a three-dimensional configuration.

14. The die of claim 11 wherein the standing-wave structure is in a stacked-die configuration.

15. The die of claim 11 wherein the metallization layer further comprises:
   a via layer below the metal layer.

16. The die of claim 15 wherein the metallization layer further comprises:
   a back end of line (BEOL) layer below the via layer and on a substrate.

17. The die of claim 16 wherein the BEOL layer is made of copper and dielectrics.

18. The die of claim 11 wherein the metal layer comprises:
   a power delivery area.

19. The die of claim 11 wherein the dielectric layer is made of benzocyclobutene (BCB).

20. The die of claim 11 wherein the metal layer has a thickness between 10 microns to 50 microns.

* * * * *